(12) United States Patent
Gan et al.

(10) Patent No.: US 7,579,392 B2
(45) Date of Patent: Aug. 25, 2009

(54) LOW-VISCOSITY EPOXY RESIN, PHENOLIC CHAIN EXTENDER, CATALYST AND BORON INHIBITOR

(75) Inventors: Joseph Gan, Strasbourg (FR); Alan R. Goodson, Rheinmuenster (DE)

(73) Assignee: The Dow Chemical Company, Midland, MI (US)

( * ) Notice: Subject to any disclaimer, the term of this patent is extended or adjusted under 35 U.S.C. 154(b) by 0 days.

(21) Appl. No.: 08/817,788

(22) PCT Filed: Oct. 13, 1995

(86) PCT No.: PCT/US95/13358

§ 371 (c)(1),
(2), (4) Date: Sep. 12, 1997

(87) PCT Pub. No.: WO96/02751

PCT Pub. Date: May 2, 1996

(65) Prior Publication Data

US 2003/0044521 A1    Mar. 6, 2003

(30) Foreign Application Priority Data

Oct. 21, 1994    (GB) .................................. 9421405.3

(51) Int. Cl.
*C09J 5/02* (2006.01)
*C08K 5/55* (2006.01)
*C08K 5/56* (2006.01)
*C08L 63/02* (2006.01)

(52) U.S. Cl. ............... 523/445; 156/307.5; 523/454; 523/455; 523/456; 523/459; 525/423; 525/438; 525/485; 525/533

(58) Field of Classification Search .......... 427/96, 427/372.2, 374.2, 386; 528/91, 92, 93, 94, 528/112, 113; 524/404, 413, 444; 523/454, 523/455, 456; 156/330
See application file for complete search history.

(56) References Cited

U.S. PATENT DOCUMENTS

| | | | |
|---|---|---|---|
| 3,738,862 A | 6/1973 | Klarquist et al. | 117/126 |
| 3,842,037 A | 10/1974 | Sinnema | 260/47 |
| 4,501,787 A | 2/1985 | Marchetti et al. | 428/236 |
| 4,868,059 A | 9/1989 | Walker et al. | 428/416 |
| 4,925,901 A | 5/1990 | Bertram et al. | 525/482 |
| 5,169,473 A * | 12/1992 | Bertram et al. | 156/307.4 |
| 5,308,895 A | 5/1994 | Gan et al. | 523/445 |
| 5,314,720 A | 5/1994 | Gan et al. | 427/386 |
| 5,342,865 A * | 8/1994 | Zwinselman et al. | 523/414 |
| 5,721,323 A | 2/1998 | Schultz et al. | 525/504 |

FOREIGN PATENT DOCUMENTS

| | | |
|---|---|---|
| EP | 0 027 568 | 4/1981 |
| EP | 0 260 768 | 3/1988 |
| EP | 0 414 160 | 2/1991 |
| EP | 0 458 502 | 11/1991 |
| EP | 0 567 248 | 10/1993 |
| EP | 0 729 484 | 9/1996 |
| WO | 86/00627 | 1/1986 |
| WO | WO 86/00627 | 1/1986 |
| WO | 89/06661 | 7/1989 |
| WO | WO 89/06661 | 7/1989 |
| WO | 94/11415 | 5/1994 |
| WO | WO 94/11415 | 5/1994 |
| WO | 94/14866 | 7/1994 |
| WO | WO 94/14866 | 7/1994 |
| WO | WO 95/12627 | 5/1995 |
| WO | 96/12752 | 5/1996 |
| WO | WO 96/12572 | 5/1996 |

OTHER PUBLICATIONS

Chemical abstracts accession No. 93070-49-6 for 1-benzyl-3-cyanoguanidine, or N-benzyl dicyandiamide, 2007, one page.*
"Epoxy Resin Composition for Use in Electrical Laminate", filed in the European Patent Office on Jan. 28, 1992, Application Serial No. 92101367.8; Applicant: The Dow Chemical Company (Masahiko Kohno et al.).
Delmonte et al., "Fiber-Reinforced Epoxy Composites", Epoxy Resins, Chemistry and Technology, (2d Ed.), pp. 889-921 (1988).
Lee et al., Handbook of Epoxy Resins, pp. 2-1-3-20 (1967).
Lee et al., Handbook of Epoxy Resins, pp. 24-31 (1967).
"Epoxy Resins", Encyclopedia of Poly. Sci. and Eng., (2d Ed.), vol. 6, pp. 341-343 (1986).
"Epoxy Resins", Encyclopedia of Poly. Sci. and Eng., (2d Ed.), vol. 6, pp. 348-356 (1986).

(Continued)

*Primary Examiner*—Robert Sellers

(57) ABSTRACT

The invention is a formulation that contains: (1) a low-viscosity epoxy resin; (2) a phenolic chain extender whose concentration is less that 0.6 equivalents phenolic hydroxyl group per equivalent of the low-viscosity epoxy resin; (3) a catalyst that promotes self-curing reactions between epoxy groups; (4) an inhibitor that inhibits the activity of the catalyst under "B-staging" conditions; (5) less than 25 weight percent of a volatile organic solvent; and (6) optionally, a multifunctional cross-linking agent. The formulation contains low levels of volatile organic solvent, and can be used to make electrical laminates. It builds molecular weight controllably in B-staging, so that dripping is avoided but the prepreg can be easily laminated.

6 Claims, No Drawings

OTHER PUBLICATIONS

Abstract of JP 02103224 A.

Abstract of JP 57034118 A.

"Epoxy Resin Composition for Use in Electrical Laminate," filed in the European Patent Office on Jan. 28, 1992, Application Serial No. 92101367.8; Applicant: The Dow Chemical Company (Masahiko Kohno, et al).

Delmonte, et al., "Fiber-Reinforced Epoxy Composites," Epoxy Resins, Chemistry and Technology, (2nd Ed.), pp. 889-921 (1988).

Lee, et al., Handbook of Epoxy Resins, pp. 2-1—3-20 (1967).

Lee, et al., Handbook of Epoxy Resins, pp. 24-31 (1967).

"Epoxy Resins", Encyclopedia of Poly. Sci. and Eng., ($2^{ND}$ Ed.), vol. 6, pp. 341-343 (1986).

"Epoxy Resins", Encyclopedia of Poly. Sci. and Eng., ($2^{ND}$ Ed.), vol. 6, pp. 348-356 (1986).

Abstract of JP 02103224 A, Apr. 16, 1980.

Abstract of JP 57034118 A, Feb. 24, 1982.

Product Data Sheet for D.E.R. 330, manufactured by The Dow Chemical Company.

Wittenwyler, C.V., "Analysis of In-Situ Process FR-4 Resin System," Sep. 1979, The Institute for Interconnecting and Packaging Electronic Circuits.

\* cited by examiner

LOW-VISCOSITY EPOXY RESIN, PHENOLIC CHAIN EXTENDER, CATALYST AND BORON INHIBITOR

The present invention relates to the art of curable epoxy-resin-containing formulations, and particularly to formulations useful for making electrical laminates.

It is known to make electrical laminates and other composites from a fibrous substrate and an epoxy-containing matrix resin. Examples of suitable processes usually contain the following steps:

(1) an epoxy-containing formulation is applied to a substrate by rolling, dipping, spraying, other known techniques and/or combinations thereof. The substrate is typically a woven or nonwoven fiber mat containing, for instance, glass fibers.

(2) The impregnated substrate is "B-staged" by heating at a temperature sufficient to draw off solvent in the epoxy formulation and optionally to partially cure the epoxy formulation, so that the impregnated substrate can be handled easily. The "B-staging" step is usually carried out at a temperature between 90° C. and 210° C. and for a time between 1 minute and 15 minutes. The impregnated substrate that results from B-staging is called a prepreg. The temperature is most commonly 100° C. for composites and 130° C. to 180° C. for electrical laminates.

(3) One or more sheets of prepreg are stacked in alternating layers with one or more sheets of a conductive material, such as copper foil, if an electrical laminate is desired.

(4) The laid-up sheets are pressed at high temperature and pressure for a time sufficient to cure the resin and form a laminate. The temperature of lamination is usually between 100° C. and 230° C., and is most often between 165° C. and 190° C. The lamination step may also be carried out in two or more stages, such as a first stage between 100° C. and 150° C. and a second stage at between 165° C. and 190° C. The pressure is usually between 50 N/cm$^2$ and 500 N/cm$^2$. The lamination step is usually carried on for 10 to 100 minutes, and most often for 45 to 90 minutes. The lamination step may optionally be carried out at higher temperatures for shorter times (such as in continuous lamination processes) or for longer times at lower temperatures (such as in low energy press processes).

(5) Optionally, the resulting copper-clad laminate may be post-treated by heating for a time at high temperature and ambient pressure. The temperatures of post-treatment are usually between 120° C. and 250° C. The post-treatment time usually is between 30 minutes and 12 hours.

The electrical laminates and processes by which they are made are described in greater detail in numerous references, such as U.S. Pat. No. 5,314,720 (May 24, 1994) and Delmonte, Hoggatt & May; "Fiber-reinforced Epoxy Composites," *Epoxy Resins, Chemistry and Technology* (2d Ed.) at 889-921 (Marcel Dekker, Inc. 1988).

The formulations that are used in such processes typically contain: (1) an advanced epoxy resin having an EEW of 400 to 530; (2) a curing agent such as dicyandiamide; (3) a catalyst to promote the reaction of the resin and the curing agent, such as 2-methylimidazole; and (4) 30 to 40 weight percent of a volatile organic solvent such as a ketone, a glycol ether, dimethylformamide, or xylenes. It is also known that the formulation may contain certain other additives. For instance:

(1) Formulations that contain boric acid are taught in U.S. Pat. No. 5,308,895 (May 3, 1994) and U.S. Pat. No. 5,314,720 (May 24,1994).

(2) Formulations that contain a chain extender such as bisphenol A or tetrabromo-bisphenol A are described in references such as the previous two U.S. patents and in European Patent Application 92101367.8 (published Jan. 28, 1992) and U.S. Pat. No. 3,738,862 (Jun. 12, 1973).

It would be desirable to reduce the quantities of volatile organic solvent that are used in the formulation. Volatile organic solvents are costly and must be cleaned out of the effluent gas from the B-stage before that gas is returned to the atmosphere. However, the low VOC (volatile organic compound) formulation must be selected to provide a suitable viscosity, since viscosity is critical in laminate making processes. See, for example, Delmonte, Hoggatt & May at 903. The level of VOC in ordinary formulations can not be reduced because the viscosity of the formulation would be too high. High viscosity resins distort the position of fibers in the substrate, and are difficult to impregnate into the substrate.

The viscosity of low VOC formulations may be reduced if the advanced epoxy resin is replaced with a lower-molecular-weight resin and a chain extender. Such low-viscosity formulations have been reported for other uses. For instance, EPO Publication 0 260 768 A2 (Mar. 23, 1988) teaches an encapsulation formulation which contains liquid epoxy resin, 0.6 to 1 equivalent of bisphenol, and an amine-(boron trifluoride) catalyst. Formulations which contain liquid epoxy resin, chain extender and catalysts or catalyst complexes have been partially-cured, and the partially-cured resins are used in curable resins in PCT Publication WO86/00627 (Jan. 30, 1986).

Formulations which contain liquid epoxy resin and chain extender have not commonly been used in laminating processes, because their viscosity in the treater and prepreg is often too low. The formulations run and drip in the treater before the B-stage is complete. Furthermore, the formulations flow too much after the prepreg is put into the laminating press. The resin is forced out of the laminate and into the press, and the resulting laminate is too thin.

Extra catalysts may be added to the formulation to encourage quick reaction of epoxy resin and chain extender in the treater, so that higher molecular weight advanced resins are produced before dripping occurs. However, those catalysts also accelerate curing of the resin with the curing agent. It is difficult to prevent the viscosity from building too high for effective lamination. Moreover, formulations which contain too much catalyst have a short shelf- or pot-life, and the resulting prepregs have a short shelf-life.

What is needed is a low VOC formulation that: (1) has a low-viscosity in the impregnation step; (2) builds molecular weight by advancement rapidly and controllably in the B-stage in order to minimize dripping; (3) controls undesirable curing reactions, to prevent excessive growth of molecular weight in the treater or during storage; and (4) provides a B-staged prepreg with sufficient viscosity to be laminated without significant loss of resin. It is a further object of the invention to present an epoxy resin formulation which is compatible with existing manufacturing equipment for electrical laminates prepared from advanced epoxy resin formulations.

Applicants invention provides these features and others as will become apparent from the entire description and examples herein.

One aspect of the present invention is a formulation comprising:
(1) a low-viscosity epoxy resin;
(2) a phenolic chain extender whose concentration is less than 0.6 equivalents of phenolic hydroxyl group per equivalent of the low-viscosity epoxy resin;
(3) a catalyst that promotes self-curing reactions between epoxy groups;
(4) an inhibitor which is a Lewis acid;

(5) less than 25 weight percent of a volatile organic solvent; and (6) optionally, a multifunctional cross-linking agent.

A second aspect of the invention is a preliminary formulation containing:

(1) a low-viscosity epoxy resin;

(2) a phenolic chain extender whose concentration is less than 0.6 equivalents of phenolic hydroxyl group per equivalent of the low-viscosity epoxy resin;

(3) a Lewis acid; and (4) no more than 20 weight percent of a volatile organic solvent.

A third aspect of the present invention is the use of a formulation as previously described in the processes to make composites and electrical laminates that are previously described.

The composition in the second aspect of the invention is useful to make formulations in the first aspect of the invention. Those formulations are useful for making electrical laminates as previously described. The compositions may also be used in encapsulation, coating and structural composite applications. The invention is described more specifically as follows.

Formulations of the present invention contain a low-viscosity epoxy resin. The low-viscosity epoxy resin preferably either:

(1) is liquid at 20° C.; or (2) has an average formula weight per epoxy equivalent of no more than 350 for all non-halogen atoms in the molecule. (For instance, diglycidyl ether of bisphenol A contains no halogen and has an average formula weight of 340. Therefore, the formula weight per epoxy equivalent of diglycidyl ether of bisphenol A is 170. The diglycidyl ether of tetrabromobisphenol A has a molecular weight of 656. However, the average formula weight of the non-halogen atoms is 336, and so the average formula weight per epoxy equivalent is 168 for non-halogen atoms in diglycidyl ether of tetrabromobisphenol A. Both diglycidyl ether of bisphenol A and diglycidyl ether of tetrabromobisphenol A are "low-viscosity epoxy resins" within the meaning of this definition.)

The average formula weight per epoxide equivalent is preferably no more than 250 and more preferably no more than 190 for non-halogen atoms in the low-viscosity epoxy resin. It is preferably at least 70, more preferably at least 110, and most preferably at least 160 for non-halogen atoms in the low-viscosity epoxy resin.

The low-viscosity epoxy resin contains on average more than 1 epoxy group per molecule and preferably contains on average at least 1.8 epoxy groups per molecule. It preferably contains on average less than 5 epoxy groups per molecule, more preferably less than 3 epoxy groups per molecule, and most preferably no more than 2.1 epoxy groups per molecule. (For certain special applications, such as high-temperature uses, resins with more epoxy groups may be optimum, such as triglycidylether of tris-(hydroxyphenyl)methane, which is commercially available as TACTIX* 742 resin. (*Trademark of The Dow Chemical Company)). The low-viscosity epoxy resin is preferably a glycidyl ether, ester or amide compound.

The low-viscosity epoxy resin is more preferably the diglycidyl ether of a diol. The diol preferably contains 2 phenolic hydroxyl groups per molecule (a dihydric phenol). The diol and the diglycidyl ether are preferably represented by Formula I:

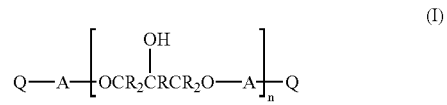

wherein:

each "A" independently represents an aliphatic group, an aromatic group or a plurality of aromatic groups (including halogenated and/or substituted aromatic groups) linked by a bond or a divalent moiety such as a lower ($C_1$-$C_6$) alkyl group, a carbonyl group, a sulfonyl group or an oxygen atom. Preferably, less than 50 percent of "A" are aliphatic groups, more preferably less than 30 percent are aliphatic groups, and most preferably 0 percent are aliphatic groups. The aliphatic groups are preferably alkyl groups or poly(alkylene oxide) groups. Each "A" is most preferably a benzene ring or two benzene rings linked by a lower alkyl group, or a halogenated variation thereof.

Each "Q" is a hydroxyl group in the diol, and is a glycidyl ether moiety represented by Formula II:

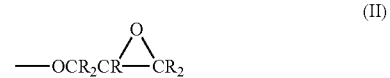

in the epoxy resin.

Each "R" represents a hydrogen atom, a halogen or a lower alkyl group. Each "R" is preferably a hydrogen atom.

"n" represents a number of repeating units. "n" may be on average 0 to 2, but it is preferably 0.1 to 0.2 in low-viscosity epoxy resin.

Examples of preferred diols include resorcinol, catechol, hydroquinone, bisphenol, bisphenol A, bisphenol AP (1,1-bis (4-hydroxylphenyl)-1-phenylethane), bisphenol F, bisphenol K or halogenated variations thereof. The low-viscosity epoxy resin is most preferably a diglycidyl ether of bisphenol A or a diglycidyl ether of a halogenated bisphenol A. Other useful low-viscosity epoxy resins are glycidyl ether derivatives of 1,1,1-tris-(hydroxyphenyl)-alkanes and halogenated variations thereof. Examples of suitable epoxy resins and processes to make them are also described in H. Lee & K. Neville, *Handbook of Epoxy Resins* at 2-1 to 3-20 (McGraw-Hill Book Co. 1967).

The formulations also contain a phenolic chain extender. The phenolic chain extender may be any compound that contains on average more than 1 and less than 3 phenolic hydroxyl groups per molecule. It preferably contains on average 1.8 to 2.1 phenolic hydroxyl groups and more preferably contains about 2 phenolic hydroxyl groups per molecule. The phenolic chain extender has the same broad description and preferred embodiments as the dihydric phenol described previously as the basis for low-viscosity epoxy resin (except that "n" in Formula I is preferably less than 0.2, more preferably less than 0.1 and most preferably 0).

The phenolic chain extender is preferably a liquid or a solid that is soluble in liquid epoxy resin, in order to minimize the need for a volatile organic solvent. It more preferably has a melting point which is higher than 100° C., and most preferably has a melting point of at least about 125° C. and no more than about 300° C. When the phenolic chain extender is non-halogenated, its molecular weight is preferably at least 110 and more preferably at least 185. The molecular weight is preferably no more than 800, more preferably no more than 500, and most preferably no more than 250. For halogenated phenolic chain extenders, the formula weight of non-halogen atoms in the chain extender preferably meets the foregoing preferred limitations, and the total molecular weight is preferably within the preferred embodiments plus the formula weight of the halogen. The phenolic chain extender may optionally be a phenol-capped oligomer (such as an oligomer which meets Formula I wherein "Q" is a hydroxyl group and "n" is on average between 0.2 and 2), but preferably the chain extender is simply a monomer (wherein "n" meets the limits previously described). The phenolic chain extender is most preferably bisphenol A or brominated bisphenol A.

The quantity of chain extender should be less than stoichiometric with the epoxy resin. The chain extender preferably contains no more than 0.55 hydroxyl equivalents per epoxy equivalent, and more preferably no more than 0.5 hydroxyl equivalents per epoxy equivalent. The chain extender preferably contains at least 0.1 phenolic hydroxyl equivalents per epoxy equivalent, and more preferably contains at least 0.2 phenolic hydroxy equivalents per epoxy equivalent and most preferably at least 0.3 phenolic hydroxy equivalents per epoxy equivalent. When the low-viscosity epoxy resin is the diglycidyl ether of bisphenol A and the chain extender is tetrabromobisphenol A, the concentration of chain extender is preferably sufficient to provide a resin containing 17 to 30 weight percent bromine, and more preferably sufficient to provide a resin containing 19 to 22 weight percent bromine.

Compositions of the present invention contain a catalyst that can catalyze epoxy-epoxy curing reactions—the reaction of epoxy groups with each other to form a cured resin. Such curing reactions are described in Vol. 6, *Encyclopedia of Poly. Sci. & Eng.* (2 d Ed.), "Epoxy Resins" at 341-343 (J. Wiley & Sons 1986). Examples of suitable catalysts include compounds containing amine, phosphine, heterocyclic nitrogen, ammonium, phosphonium, arsonium or sulfonium moieties. More preferred catalysts are the heterocyclic nitrogen and amine-containing compounds and even more preferred catalysts are heterocyclic nitrogen-containing compounds.

Catalysts (as distinguished from cross-linkers) preferably contain on average no more than about 1 active hydrogen moiety per molecule. Active hydrogen moieties include hydrogen atoms bonded to an amine group, a phenolic hydroxyl group, or a carboxylic acid group. For instance, the amine and phosphine moieties in catalysts are preferably tertiary amine or phosphine moieties; and the ammonium and phosphonium moieties are preferably quaternary ammonium and phosphonium moieties.

Examples of suitable heterocyclic nitrogen catalysts include those described in Bertram, U.S. Pat. No. 4,925,901 (May 15, 1990). Preferable heterocyclic secondary and tertiary amines or nitrogen-containing catalysts which can be employed herein include, for example, imidazoles, benzimidazoles, imidazolidines, imidazolines, oxazoles, pyrroles, thiazoles, pyridines, pyrazines, morpholines, pyridazines, pyrimidines, pyrrolidines, pyrazoles, quinoxalines, quinazolines, phthalozines, quinolines, purines, indazoles, indoles, indolazines, phenazines, phenarsazines, phenothiazines, pyrrolines, indolines, piperidines, piperazines and combinations thereof, Especially preferred are the alkyl-substituted imidazoles; 2,5-chloro-4-ethyl imidazole; and phenyl-substituted imidazoles, and mixtures thereof. Even more preferred are N-methylimidazole; 2-methylimidazole; 2-ethyl-4-methylimidazole; 1,2-dimethylimidazole; and 2-phenylimidazole. Especially preferred is 2-methylimidazole.

Among preferred tertiary amines that may be used as catalysts are those mono- or polyamines having an open-chain or cyclic structure which have all of the amine hydrogen replaced by suitable substituents, such as hydrocarbon radicals, and preferably aliphatic, cycloaliphatic or aromatic radicals. Examples of these amines include, among others, methyl diethanol amine, triethylamine, tributylamine, dimethyl benzylamine, triphenylamine, tricyclohexyl amine, pyridine and quinoline. Preferred amines are the trialkyl, tricycloalkyl and triaryl amines, such as triethylamine, triphenylamine, tri-(2,3-dimethylcyclohexyl)amine, and the alkyl dialkanol amines, such as methyl diethanol amines and the trialkanolamines such as triethanolamine. Weak tertiary amines, for example, amines that in aqueous solutions give a pH less than 10 in aqueous solutions of 1 M concentration, are particularly preferred. Especially preferred tertiary amine catalysts are benzyldimethylamine and tris-dimethylaminomethyl phenol.

The concentration of catalyst is preferably at least 0.05 phr and more preferably at least 0.1 phr. It is preferably less than 3 phr and more preferably no more than 1 phr. (For the purposes of this application only, "phr" or "parts per 100 parts resin" refers to the parts of a material per 100 parts of the combined low-viscosity epoxy resin and chain extender, by weight.)

The present invention also contains an inhibitor which inhibits the activity of the catalyst during B-staging. The inhibitor is a Lewis acid. Examples of preferred inhibitors include halides, oxides, hydroxides and alkoxides of zinc, tin, titanium, cobalt, manganese, iron, silicon, boron, aluminum and similar compounds (other than boron halides)—for instance boric acid, boroxines (such as trimethoxyboroxine), boron oxide, alkyl borates, zinc halides (such as zinc chloride) and other Lewis acids that tend to have a relatively weak conjugate base. When the formulation is intended for use in electrical laminates, then the inhibitor preferably contains no significant levels of halide. The most preferred inhibitor is boric acid. Boric acid as used herein refers to boric acid or derivatives thereof, including metaboric acid and boric anhydride. The formulation preferably contains at least 0.3 moles of inhibitor per mole of catalyst, and more preferably contains at least 0.6 moles of inhibitor per mole of catalyst. The formulation preferably contains no more than 3 moles of inhibitor per mole of catalyst and more preferably contains no more than 2 moles of inhibitor per mole of catalyst.

The inhibitor and catalysts may be separately added to the compositions of this invention, or may be added as a complex. The complex is formed by contacting and intimately mixing a solution of the inhibitor with a solution of the catalyst. Optionally, an acid having a weak nucleophilic anion may be present. Such contacting generally is performed at ambient temperature, although other temperatures may be used, for example, temperatures of from 0° C. to 100° C., more preferably from 20° C. to 60° C. The time of contacting is that sufficient to complete formation of the complex, and depends on the temperature used, with from 1 to 120 minutes preferred, and 10 to 60 minutes more preferred.

It is theorized, without intending to be bound, that the advancement reaction of epoxy resin with phenolic chain extender and the curing reaction of epoxy resin with epoxy resin usually occurs simultaneously. If catalyst is added to increase one reaction during B-staging, the rate of the other reaction is also increased. On the other hand, inhibitors used in the present invention retard the curing reaction of epoxy resin with epoxy resin at B-stage temperatures, but have no effect on or accelerate the advancement reaction of epoxy resin with phenolic chain extender in the B-stage. The effect of the inhibitor is reduced at higher temperatures, so that epoxy-epoxy reactions may take place in the lamination step. This makes it easy to control the growth of viscosity in the B-stage by selection and proportions of low-viscosity epoxy resin and phenolic chain extender.

The formulation preferably further contains a low proportion of organic solvent. It more preferably contains a mixture of solvents useful for dissolving the individual components in the formulation. The preferred volatile organic solvents to dissolve epoxy resins are well known, and it is known how to use them to obtain desired viscosity. Examples of suitable solvents are taught in H. Lee & K. Neville, *Handbook of Epoxy Resins* at 24-31 (McGraw-Hill Book Co. 1967). Examples of preferred solvents include ketones (such as methyl ethyl ketone, methoxyacetone or acetone); ethers; esters; glycols; glycol ethers; $C_1$-$C_8$ alcohols; and aromatic hydrocarbons (such as xylenes). The catalyst and the inhibitor are preferably dissolved in polar solvents, such as dimethylsulfoxide (DMSO), glycerine and dimethylformamide, with alcohols having from 1 to 6 carbon atoms and glycols having from 2 to 6 carbon atoms being more preferred. The solvent may also contain up to 30 percent water as disclosed in European Patent Application 0 567 248.

The formulation preferably contains no more than 20 percent volatile organic solvent and more preferably no more than 15 percent by weight. The formulation may contain as little as 0 percent volatile organic solvent but preferably contains at least 5 percent volatile organic solvent by weight.

The formulation preferably further contains a multifunctional cross-linker. Such multifunctional cross-linkers are described in numerous references, such as Vol. 6, *Encyclopedia of Poly. Sci. & Eng.,* "Epoxy Resins," at 348-56 (J. Wiley & Sons 1986). Examples of suitable multifunctional cross-linkers include known curing agents for epoxy resins, such as polyamines, polyamides, polyanhydrides, polyphenols and polyacids that contain more than two reactive sites per molecule on average. Preferred examples of multifunctional cross-linkers include dicyandiamide and polyphenols such as novolacs. Examples of other multifunctional cross-linkers which can be used include polyanhydrides that are taught in PCT Publication WO94/11415 (published May, 26, 1994).

Multifunctional cross-linkers (as opposed to catalysts and chain extenders) preferably contain on average more than two active hydrogen moieties per molecule. For instance, the cross-linker preferably contains a plurality of secondary amine groups, one or more primary amine groups, more than 2 phenolic hydroxyl groups, a plurality of primary amide groups or more than two carboxylic acid groups.

The quantity of multifunctional cross-linker is preferably selected such that the formulation contains a stoichiometric excess of low-viscosity epoxy resin over the combination of phenolic chain extender and multifunctional cross-linker. (For the purposes of this application, dicyandiamide is taken as having 5 to 7 curing sites per molecule.) The formulation preferably contains no more than 0.75 equivalents of chain extender and cross-linker per epoxide equivalent, more preferably no more than 0.6 equivalents, and most preferably no more than 0.5 equivalents. The formulation may contain 0 equivalents of multifunctional cross-linker, but preferably contains at least 0.01 equivalents per epoxide equivalent, more preferably contains at least about 0.05 equivalents, and most preferably contains at least 0.1 equivalents. When the multifunctional cross-linker is dicyandiamide, the formulation preferably contains at least 0.05 phr and more preferably at least 0.1 phr of dicyandiamide. It preferably contains no more than 2.25 phr and more preferably no more than 1.5 phr.

The formulation preferably further contains a stabilizer to prevent premature reaction of the low-viscosity epoxy resin and the chain extender during storage and shipping. Strong inorganic and organic acids and the anhydrides and esters of said acids (including half esters and part esters) have been found to be particularly effective as reaction inhibitors. By the term "strong acid" it is meant an organic acid having a $pK_a$ value below 4, preferably below 2.5. Examples of preferred reaction inhibitors include inorganic acids such as hydrochloric acid, sulfuric acid and phosphoric acid; inorganic acid anhydrides such as phosphoric acid anhydride ($P_2O_5$); esters of inorganic acids such as alkyl, aryl and aralkyl and substituted alkyl, aryl and aralkyl sulfonic acids such as p-toluene sulfonic acid and phenyl sulfonic acid and stronger organic carboxylic acids such as trichloroacetic acid and alkyl esters of said acids, such as the alkyl esters of p-toluene sulfonic acid, for example, methyl-p-toluene sulfonate, and ethyl-p-toluene sulfonate and methanesulfonic acid methylester. More preferred reaction inhibitors include alkyl esters of sulfuric acid, arylsulfonic acids or aralkylsulfonic acids. Most preferably, the stabilizer is a lower ($C_1$-$C_6$) alkyl ester of p-toluene sulfonic acid. The quantity of stabilizer is preferably 0 to 1 phr.

The viscosity of the formulation at 20° C. is preferably no more than 800 mPa·s, and more preferably no more than 500 mPa·s. (Viscosity is measured by a CANNON-FENSKE viscometer according to the ordinary instructions for operation.) The viscosity of the formulation is preferably at least 50 mPa·s and more preferably at least 100 mPa·s.

The formulations previously described may be used to make electrical laminates as described in the background of the invention. The formulations have relatively low-viscosity, but advance quickly and controllably during B-staging to avoid drip, and cure to provide good laminates in the laminating step. Moreover, the presence of inhibitor in the formulation increases the total heat of reaction released by curing the formulation. This suggests that the formulations have increased cross-link density when cured.

For packaging and shipment, it may be convenient to supply a preliminary formulation as described in the second aspect of the invention. The preliminary formulation contains low-viscosity epoxy resin, phenolic chain extender, inhibitor, and a solvent as previously described. The ratios are also as previously described, except that the formulation preferably contains no more than 15 weight percent solvent, and more preferably no more than 10 weight percent solvent. The formulation preferably contains at least 1 percent solvent and more preferably at least 5 percent solvent. The formulation preferably contains at least 0.05 phr inhibitor, and more preferably at least 0.2 phr inhibitor. It preferably contains no more than 2 phr inhibitor, and more preferably no more than 1 phr inhibitor. The formulation can also contain less than 0.05 equivalents of multifunctional cross-linking agent per epoxide equivalent.

The preliminary formulation preferably contains a less than catalytic quantity of curing catalyst. For instance, the concentration of catalyst preferably contains less than 0.1 phr catalyst, more preferably less than 0.05 phr catalyst, and most preferably less than 0.01 phr catalyst. The preliminary formulation also preferably contains less cross-linker than would be required to cure the formulation. The concentration of cross-linker in the preliminary formulation is preferably less than 0.1 equivalents per epoxide equivalent, more preferably less than 0.05 equivalents, and most preferably less than 0.01 equivalents. The concentrations of catalyst and curing agent are most preferably about 0.

Such formulations can be stored for long periods without loss of stability. The invention is illustrated with greater specificity in the following specific examples.

EXAMPLE 1

Formulations Containing Boric Acid Inhibitor and Dicyandiamide Cross-linker

Six formulations were made. Each formulation contained 65.5 parts D.E.R.* 330 (*Trademark of The Dow Chemical Company) liquid epoxy resin, 34.5 parts tetrabromobisphenol A and 5.26 parts methyl ethyl ketone. A 10 percent solution of boric acid in ethanol was added to the blend to provide the quantity of boric acid shown in Table I.

After the formulations were aged overnight, the following additional components were added: 9.33 parts of a solution containing 7.5 parts dicyandiamide dissolved in 30.5 parts dimethylformamide and 62 parts propylene glycol monomethyl ether; 1.25 parts of a 20 percent solution of 2-methylimidazole in ethanol; and sufficient methyl ethyl ketone to dilute the formulation to 80 percent solids. The formulations were loaded into an aluminum calorimetry capsule. Each formulation was placed under vacuum at room temperature for a period of one hour to draw off the solvent. The advancement and curing of each formulation

TABLE I

| Formulation | Boric Acid (parts) |
|---|---|
| A* | 0 |
| 1 | 0.1 |
| 2 | 0.2 |
| 3 | 0.3 |
| 4 | 0.4 |
| 5 | 0.5 |

*Formulation A is not an example of the invention was studied by differential scanning calorimetry (DSC) using a METTLER DSC30 calorimeter and a temperature increase of 10° C. per minute.

In Formulation A, a broad advancement peak ran from about 105° C. to a maximum of 160° C., and a sharp curing peak hit a maximum at 165° C., essentially on top of the advancement peak. In Formulation 1, the advancement peak remained at a maximum of about 160° C., but the maximum of the curing peak had moved slightly to about 170° C. In Formulation 2, the two peaks were almost completely separated, as advancement showed a broad peak at 160° C. and curing showed a broad peak at about 195° C. In Formulations 3, 4 and 5 the peaks for advancement and curing were essentially separate. The advancement peaks ran from about 110° C. to about 170° C., with a maximum at about 15.5. The curing peak ran from about 175° C. to about 225° C. with a maximum at about 205° C. The experiments show that when the concentration of boric acid in the formulation increases, the advancement reaction and the curing reaction separate into two main different peaks which occur at two different temperatures. This separation allows rapid, controllable advancement in the B-stage without excessive curing.

EXAMPLE 2

Formulation Containing Boric Acid and Phenolic Cross-linker

A formulation was made that contained: 65.5 parts D.E.R.* 330 (*Trademark of The Dow Chemical Company) liquid epoxy resin, 34.5 parts tetrabromobisphenol A, 5.26 parts methyl ethyl ketone, and 5 parts of a solution containing 20 weight percent boric acid in methanol. The solution was aged overnight. Then the following components were added: 4 parts of a solution containing 50 weight percent PERSTORP 85-36-28 phenol novolac resin (commercially available from PERSTORP AS, Perstorp, Sweden and containing 4 to 5.5 phenolic hydroxyl groups per molecule) in acetone; 3.5 parts of a solution containing 20 weight percent 2-methylimidazole dissolved in methanol; and sufficient methyl ethyl ketone to dilute the formulation to 80 percent solids. The advancement and curing of the formulation was studied by DSC as described in Example 1. The scan exhibits a broad advancement peak from 100 to 160 with two maxima at about 135° C. and 145° C., and a broad curing peak from about 160° C. to 220° C. with a maximum height at about 210° C. The experiment shows that a similar separation of advancement and curing are observed when the cross-linker is a phenolic resin, rather than dicyandiamide.

EXAMPLE 3

Preparation of Prepregs

A formulation was prepared as described in Example 2, except that the cross-linking agent contained a 50/50 mixture of the PERSTORP phenol novolac and tetraphenolethane. The viscosity of the formulation was measured at 25° C. using an ICI cone and plate set using Cone "C", and was 80 mPa s. The formulation was applied to a substrate of glass cloth (Type 7628 which can be purchased from Porcher Textile, Badinieres, Fr-38300 Bourgoin-Jallieu France, or Interglas Textil GmbH, Ulm/Donau, Germany) by dipping. The impregnated substrates were passed through a CARATSCH pilot treater (built by Caratsch AG, Bremgarten, Switzerland) having a 3 meter horizontal oven at a temperature of 152° C. and at speeds of 0.8, 1.0, 1.2 and 1.8 m/minutes to B-stage the resin and form a prepreg. The prepregs were cracked, and powders of the B-staged resins were recovered. The B-staged resin was cured in a differential scanning calorimeter according to the procedure in Example 1. The first three experiments provided essentially identical results; a single broad peak from about 150° C. to 280° C., with a maximum height at about 210° C. The final experiment, at 1.8 m/min, showed the same broad peak, but also showed a slight broad hump from about 100° C. to 150° C. with a maximum at about 135° C. We attribute the hump to uncompleted advancement. The experiments show that, within reason, the formulation provides a relatively controlled and consistent B-staging, regardless of the treater speed and residence time.

EXAMPLE 4

Preparation of Laminates

Formulations are prepared as described in Examples 1 and 2 and shown in Table II. Each formulation contained 80 weight percent solids and 20 weight percent volatile organic solvents. The formulations were applied to glass cloth as described in Example 3. The glass cloths were passed through a CARATSCH pilot treater having a 3 meter horizontal oven at an air temperature as shown in Table II, using a winding speed shown in Table II. The resin content of each prepreg was measured using 10 cm×10 cm square sheets of glass cloth before and after prepreg production, according to Method IPC-L-109B, IPC-TM-650: 2.3.16 (available from the Institute for Interconnecting and Packaging Electronic Circuits, Lincolnwood, Ill., USA.) Results appear in Table II. Eight sheets of each prepreg were laid-up in alternating layers with sheets of copper foil. The laid-up prepregs were cured under a pressure of 250 N/cm² according to the following temperature profile: temperature was raised from room temperature to 170° C. over a period of 40 minutes, then maintained at 170° C. to 185° C. for a period of 60 minutes, then cooled from 185° C. to room temperature over a period of 20 minutes. The resulting laminates received no post-treatment.

The following tests were performed on each cured laminate:
(a) N-methylpyrrolidone (NMP) pick-up was measured by weighing a 5 cm×5 cm sheet of laminate, immersing it in NMP at 23° C. for 30 minutes, and then reweighing. The results are shown in Table II, expressed as a percent gain.
(b) Copper peel strength was measured by Method IPB-L-115B, IPC-TM-650: 2.4.8. The results are shown in Table II expressed in N/cm.
(c) Laminate glass-transition temperature was measured using the DSC from Example 1, scanning from 50° C. to 220° C. at 10° C. per minute and taking the second scan as the glass-transition temperature. The results are expressed in Table II in ° C.
(d) Water resistance was measured by putting the laminates in a pressure cooker for 120 minutes according to Method IPC-A-600, IPC-MI-660 and IPC-TM-650:2.6.16. All laminates passed the test with 100 percent.

TABLE II

|  | 11 | 12 |
|---|---|---|
| Formulation | | |
| Liquid Epoxy Resin/TBBA blend (parts solid) | 100 | 100 |
| Boric acid (phr solid) | 1.0 | 0.3 |
| Phenolic cross-linker (phr solid) | 2.0 | — |
| Dicyandiamide (phr solid) | — | 0.7 |
| 2-methylimidazole (phr solid) | 0.7 | 0.5 |
| Varnish % solids (wt %) | 80 | 80 |
| Varnish viscosity (mPa.s)[1] | 80 | 110 |
| B-staging | | |
| Treater setting | 2 | 2 |
| Treater Temperature (° C.) | 152 | 170 |
| Treater Speed (m/min) | 1.0 | 0.9 |
| Prepreg resin content (percent) | 43 | 45 |
| Laminate properties | | |
| NMP-pick-up (wt %) | 0.05 | 0.08 |
| Copper peel strength (N/cm) | 15.1 | 17.3 |
| Laminate Tg (° C.) | 146 | 138 |

[1](measured by ICI cone and plate using cone "C" at 25° C.)

What is claimed is:

1. A curable, low volatile organic solvent, epoxy resin-containing formulation comprising:
   (1) a low-viscosity epoxy resin, being either a liquid at 20° C. or having an average formula weight per epoxy equivalent of no more than 350 for all non-halogen atoms in the molecule;
   (2) a phenolic chain extender which contains an average 1.8-2.1 phenolic hydroxyl groups per molecule and whose concentration is from 0.1 to less than 0.6 equivalents of phenolic hydroxyl group per epoxide equivalent of the low-viscosity epoxy resin;
   (3) a catalyst containing amine, phosphine, heterocyclic nitrogen ammonium, phosphonium, arsonium sulfonium moieties that promotes self-curing reactions between epoxy groups containing on average no more than about 1 active hydrogen moiety per molecule;
   (4) an inhibitor which is a Lewis acid in an inhibiting amount of from at least 0.3 mole to 3 moles of inhibitor per mole of catalyst which inhibits the activity of the catalyst during B-staging so as to retard the curing reaction of epoxy resin with epoxy resin at B-stage and which is selected from the group consisting of boric acid, metaboric acid, boroxine, and boron oxide;
   (5) from at least 5 weight percent to no more than 20 weight percent of a volatile organic solvent; and
   (6) a multifunctional cross-linking agent containing on average more than two active hydrogen moieties per molecule; wherein the formulation contains at least 0.01 equivalents of multifunctional cross-linking agent per epoxide equivalent;
wherein the viscosity of the resultant curable, low volatile organic solvent, epoxy resin-containing formulation for making composites or laminates at 20° C. is no more than 800 mP·s; and wherein the formulation contains no more than 0.5 equivalents of phenolic chain extender and multifunctional cross-linking agent per epoxide equivalent.

2. A formulation as described in claim 1 wherein the chain extender is a dihydric phenol or a halogenated variation thereof having a melting point higher than 100° C.

3. A formulation as described in claim 1 wherein the multifunctional cross-linking agent is a polyamine, polyamide, polyanhydride, polyphenol, or polyacid compound that contains more than two reactive sites per molecule on average, and the concentration of multifunctional cross-linking agent is at least 0.05 equivalents per epoxide equivalent.

4. A formulation as described in claim 1 wherein the formulation contains from 0.2 to 0.5 equivalents of chain extender (based on phenolic hydroxyl groups) per epoxy equivalent.

5. A formulation as described in claim 1 wherein the catalyst has a concentration of from 0.05 to less than 3 parts per 100 parts resin, by weight.

6. A process to make an electrical laminate, said process containing the steps of:
   (1) applying the formulation of claim 1 to form an impregnated substrate;
   (2) heating the impregnated substrate at a temperature sufficient to draw off solvent in the epoxy formulation and optionally to partially cure the epoxy formulation, whereby a prepreg is formed;
   (3) stacking one or more sheets of prepreg in alternating layers with one or more sheets of a conductive material; and
   (4) pressing the laid-up sheets at high temperature and pressure for a time sufficient to cure the resin and form a laminate.

* * * * *